United States Patent
Tong et al.

(10) Patent No.: US 8,395,351 B2
(45) Date of Patent: Mar. 12, 2013

(54) MULTIMETER WITH CHARGING SYSTEM

(75) Inventors: Song-Lin Tong, Guangdong (CN);
Qi-Yan Luo, Guangdong (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 215 days.

(21) Appl. No.: 13/069,392

(22) Filed: Mar. 23, 2011

(65) Prior Publication Data
US 2012/0161694 A1 Jun. 28, 2012

(30) Foreign Application Priority Data
Dec. 27, 2010 (CN) .......................... 2010 1 0606881

(51) Int. Cl.
*H02J 7/00* (2006.01)
*G01R 1/38* (2006.01)
*H01B 1/16* (2006.01)

(52) U.S. Cl. ........ 320/106; 320/110; 320/125; 320/138; 324/115; 324/427; 324/437; 324/754.01; 455/189.1

(58) Field of Classification Search ................... 320/106
See application file for complete search history.

(56) References Cited

U.S. PATENT DOCUMENTS

| | | | | |
|---|---|---|---|---|
| 4,746,852 A * | 5/1988 | Martin | .......................... | 320/106 |
| 5,329,239 A * | 7/1994 | Kindermann et al. | ......... | 324/678 |
| 5,349,535 A * | 9/1994 | Gupta | .............................. | 702/63 |
| 5,557,198 A * | 9/1996 | Matthews et al. | ............. | 324/115 |
| 6,133,742 A * | 10/2000 | Bridges et al. | ................ | 324/676 |
| 8,283,942 B2 * | 10/2012 | Stanton | .................... | 324/764.01 |
| 2010/0244868 A1 * | 9/2010 | Cantave et al. | ............... | 324/754 |

* cited by examiner

*Primary Examiner* — Yalkew Fantu
(74) *Attorney, Agent, or Firm* — Altis Law Group, Inc.

(57) ABSTRACT

A multimeter includes a main body, two probes extending from the main body, a battery unit arranged in the main body, and a charging system arranged in the main body and configured for charging the battery. The charging system includes a microcontroller with an external input voltage sampling circuit, a battery voltage sampling circuit and a voltage regulator circuit each electrically connected the microcontroller. The microcontroller compares sampled signals from the external input voltage sampling circuit and the battery voltage sampling circuit, and controls the voltage regulator circuit to regulate the external input voltage to be applicable to the battery based on the comparison.

7 Claims, 5 Drawing Sheets

MULTIMETER WITH CHARGING SYSTEM

BACKGROUND

1. Technical Field

The present disclosure relates to multimeters, and particularly to a multimeter with a charging system.

2. Description of Related Art

Typical multimeters use one time batteries or rechargeable batteries as a source of power. When the batteries are exhausted, they have to be changed or to be recharged, and the multimeters have to wait the new power to go on work.

What is needed, therefore, is a multimeter, which can overcome the above shortcomings.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail below and with reference to the drawings.

Figure 1:
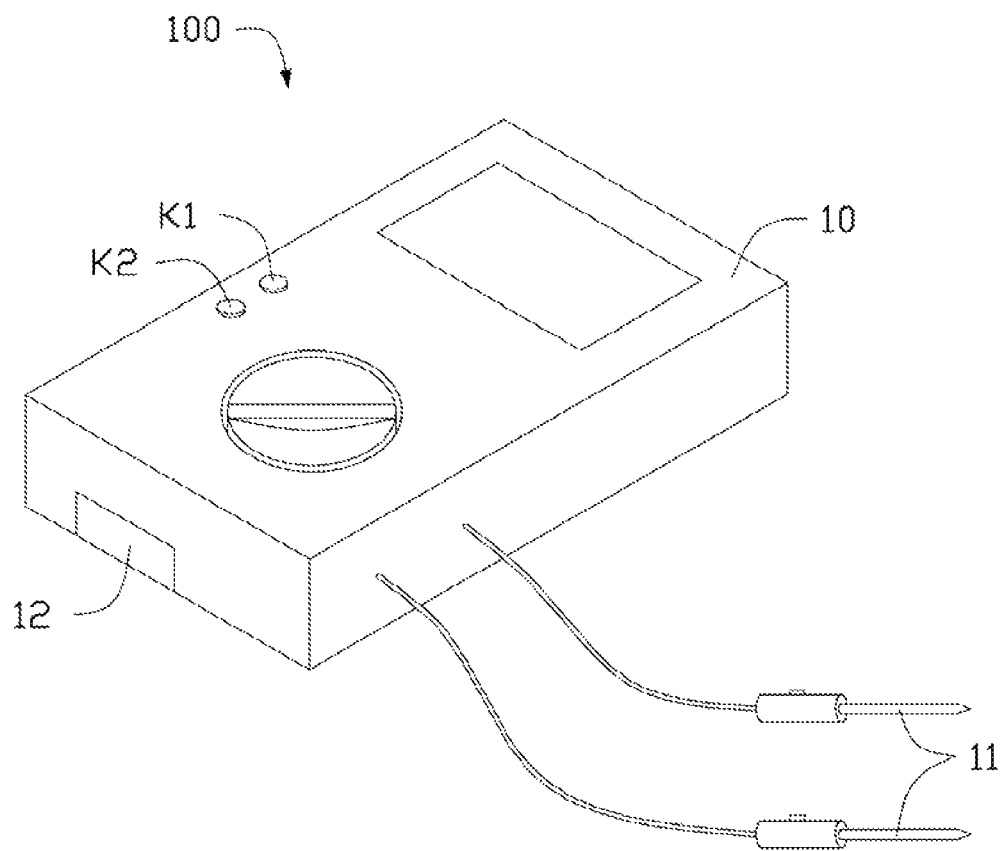
FIG. 1 shows a multimeter including a main body, two probes electrically connected to the main body, a battery unit, and a charging system.
Figure 2:
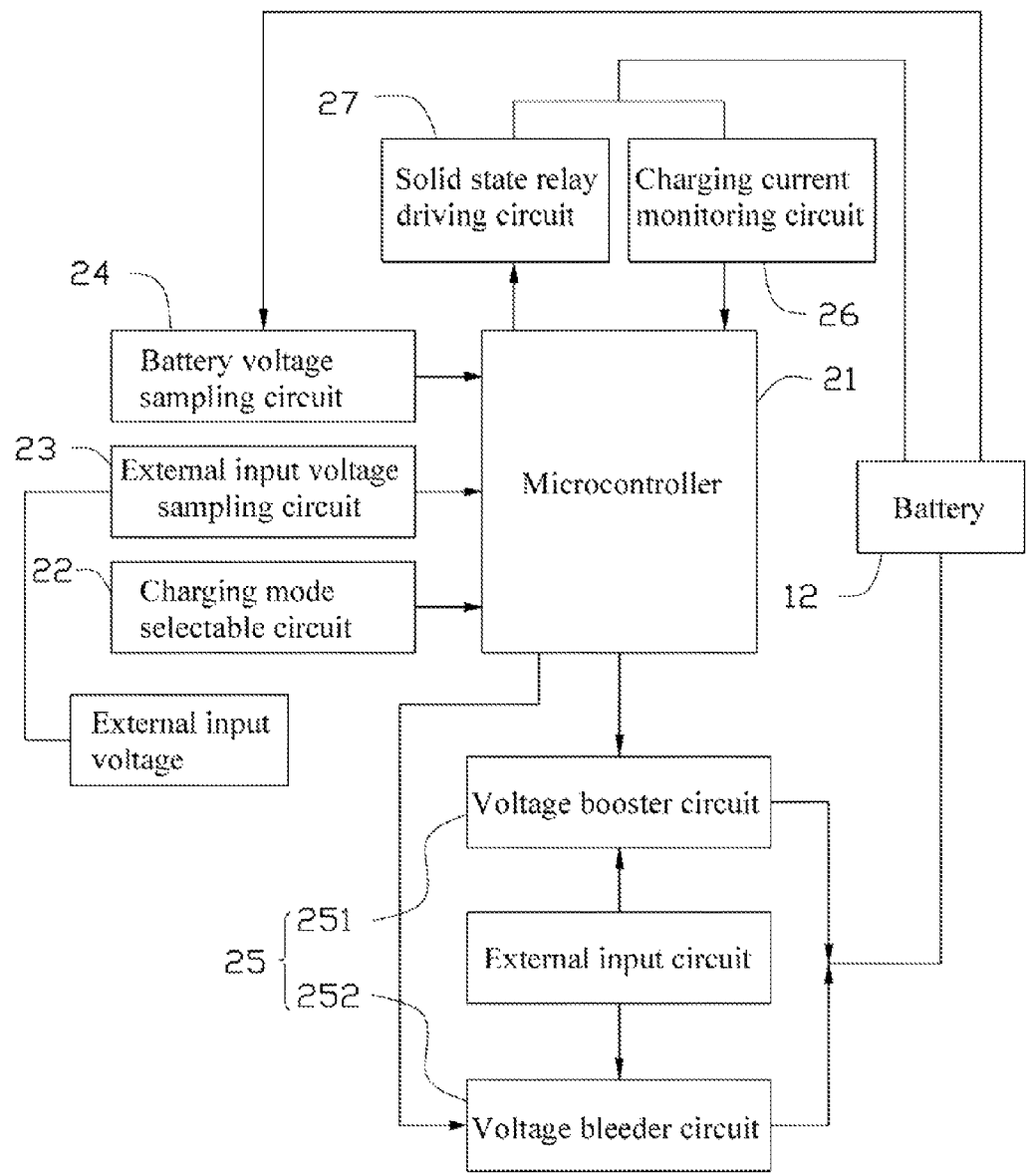
FIG. 2 is a working principle chart of the charging system of the multimeter of FIG. 1.
Figure 3:
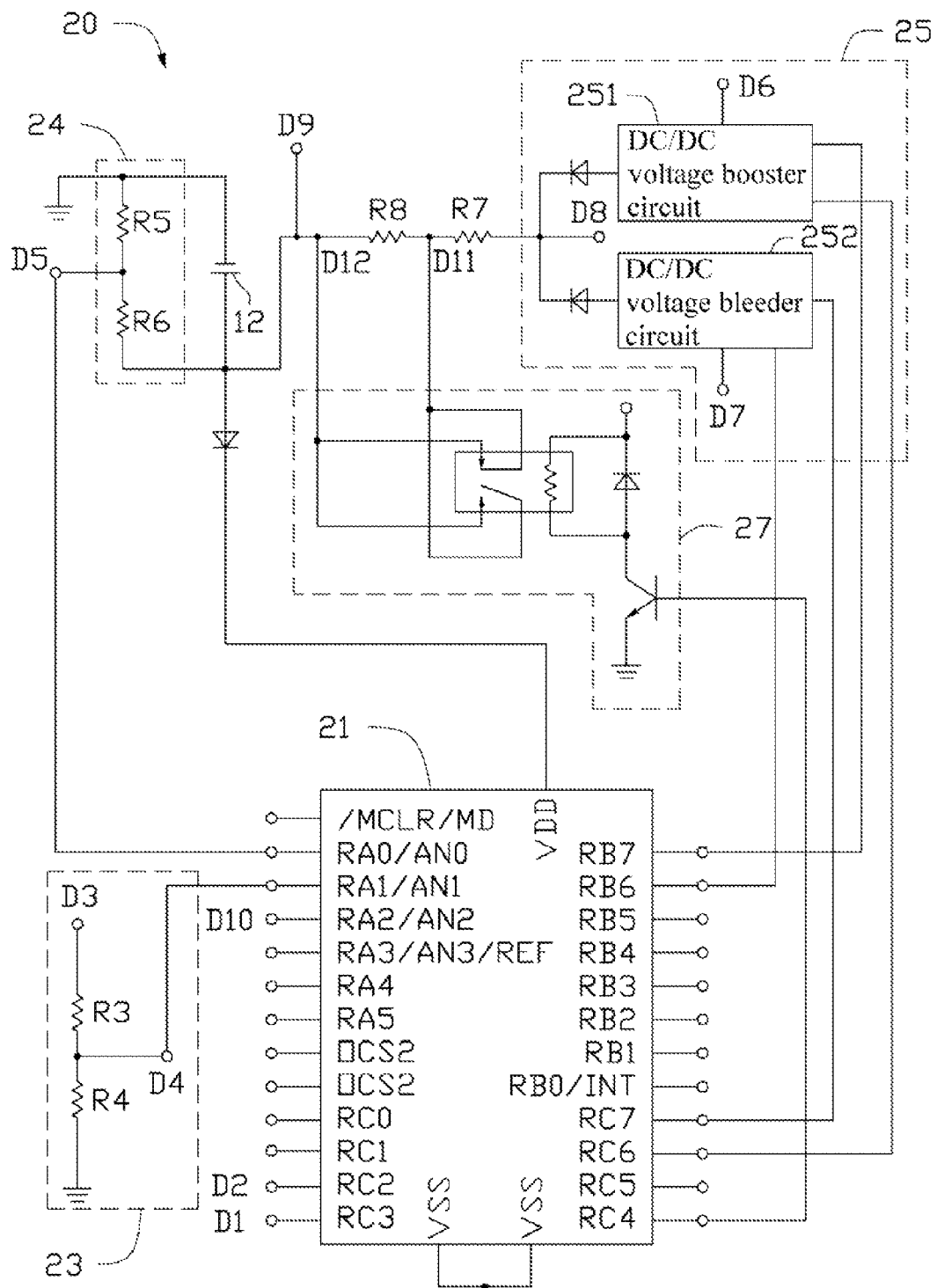
FIGS. 3-5 are circuits of the charging system of multimeter of FIG. 1.
Figure 4:
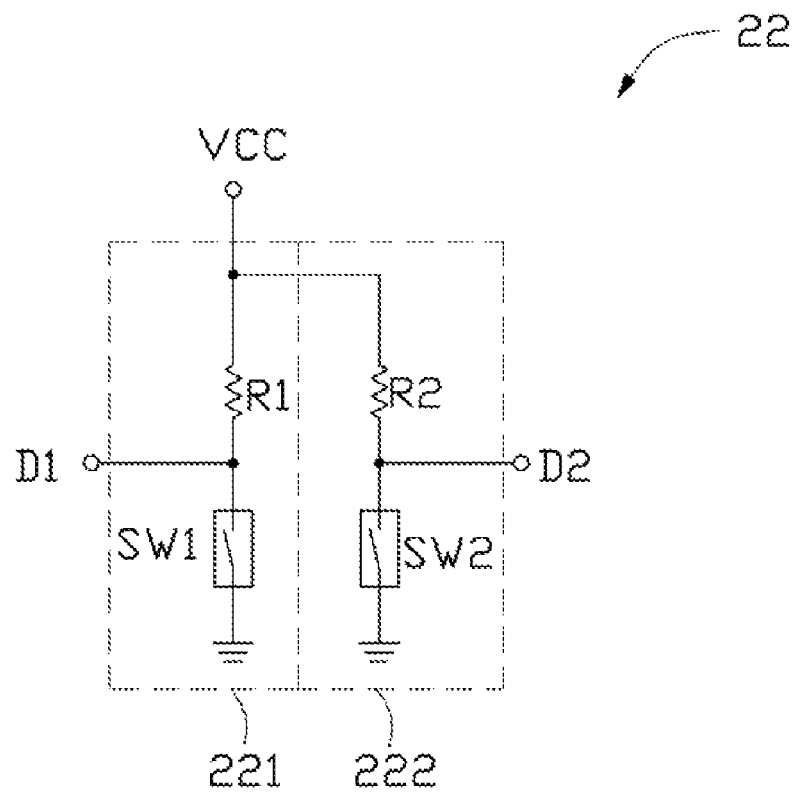
Figure 5:
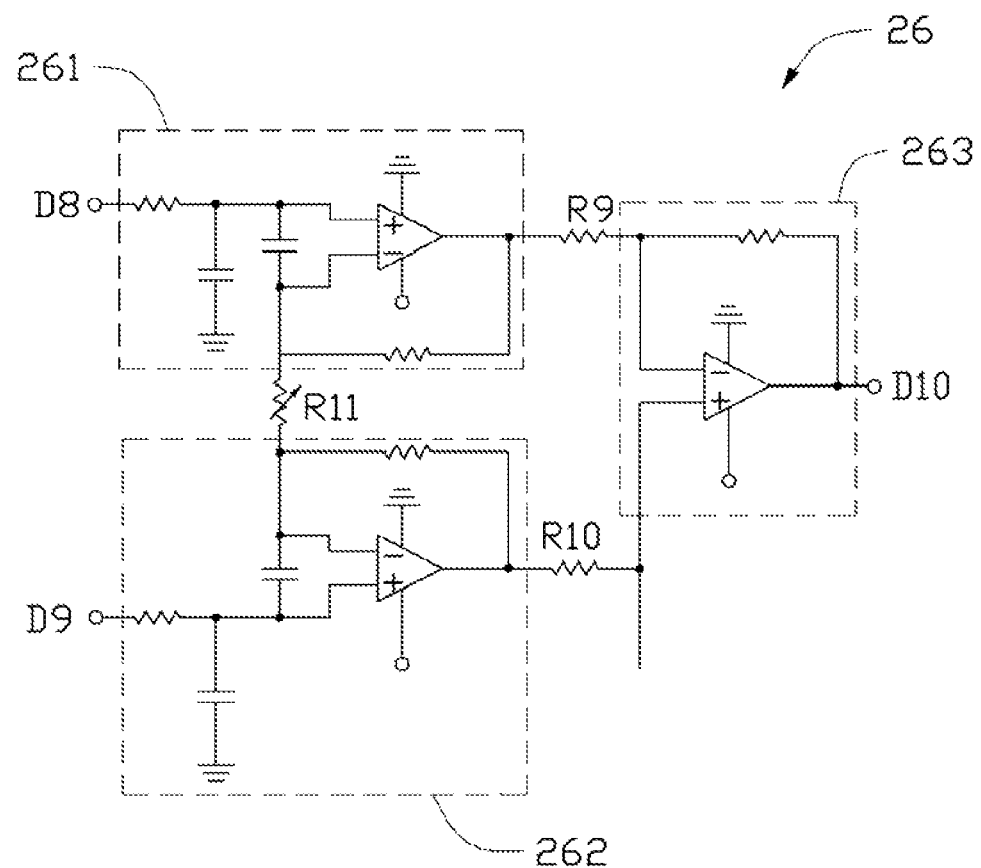

FIG. 1 shows a multimeter 100 including a main body 10, two probes 11 electrically connected to the main body 10, a battery unit 12, and a charging system 20. The charging system 20 controls charging of the battery unit 12 of the multimeter 100 through the probes 11.

The main body 10 has two switchable keys K1 and K2 separately arranged on a surface of the main body 10. The battery unit 12 can have micro pulse current rechargeable alkali battery or continuous current rechargeable batteries, such as lithium ion battery. The keys K1 corresponds to the alkali battery, and the keys K2 corresponds to the other rechargeable battery to switch on or off for charging the battery unit 12.

The charging system 20 includes a microcontroller 21 with a charging mode selectable circuit 22, an external input voltage sampling circuit 23, a battery voltage sampling circuit 24, a voltage regulator circuit 25, a charging current monitoring circuit 26 and a solid state relay driving circuit 27 each controlled by a leading pin of the microcontroller 21. In one embodiment, the microcontroller 21 can be PIC16F73 of MIRCOCHIP Corporation.

The charging mode selectable circuit 22 is used to send out a battery type signal, for example micro pulse current rechargeable alkali battery type signal or continuous current rechargeable battery type signal to the microcontroller 21, such that the microcontroller 21 activates an applicable charging mode for the battery. The charging mode selectable circuit 22 includes a first charging mode circuit 221 and a second charging mode circuit 222 in parallel connection. The first charging mode circuit 221 includes a resistor R1 and a switch SW1 in series connection, and two ends of the resistor R1 are electrically connected to the switch SW and a power VCC, respectively. An electrical contact D1 is arranged between the resistor R1 and the switch SW1. The second charging mode circuit 222 includes a resistor R2 and a switch SW2 in series connection, and two ends of the resistor R2 are electrically connected to the switch SW2 and the power VCC. An electrical contact D2 is arranged between the resistor R2 and the switch SW2. The first charging mode circuit 221 is electrically connected to the microcontroller 21 through the electrical contact D1, and the second charging mode circuit 222 is electrically connected to the microcontroller 21 through the electrical contact D2.

The switches SW1 and SW2 correspond to the keys K1 and K2 to switch on or off the first and second charging mode circuits 221 and 222. In application, the user selects one of the keys K1 and K2 to switch on the corresponding one of the first and second charging mode circuits 221 and 222 according to the battery type. Then the charging mode selectable circuit 22 sends out a battery type signal to the microcontroller 21, such that the microcontroller 21 activates an applicable charging mode for the battery. For example, when the alkali battery needs to be charged, the user selects the key K1. Then, the microcontroller 21 may use micro pulse currents to charge the battery, when a rechargeable battery, such as lithium ion battery, needs to be charged, the user selects the key K2, and then the microcontroller 21 may use a continuous current to charge the battery.

It is understood that, if another charging mode is applicable for the alkali battery, can be applied to the microcontroller 21.

The external input voltage sampling circuit 23 includes two resistors R3 and R4 in series connection. One end of the resistor R3 is electrically connected to both of the probes 11, the other end of the resistor R3 is connected to the ground via the resistor R4. An electrical contact D4 is arranged between the resistors R3 and R4 and the external input voltage sampling circuit 23 is electrically connected to the microcontroller 21 via the electrical contact D4.

The external input voltage sampling circuit 23 is used to sample the input voltage from the probes 11, and send out the sample signal to the microcontroller 21.

The battery voltage sampling circuit 24 includes two resistors R5 and R6 in a series connection. One end of the resistor R5 is connected to the ground, the other end of the resistor R5 is electrically connected to the positive terminal of the battery unit 12. An electrical contact D5 is arranged between the resistors R5 and R6, and the battery voltage sampling circuit 24 is electrically connected to microcontroller 21 via the electrical contact D5.

The battery voltage sampling circuit 24 is used to sample the voltage of the battery unit 12, and send out a voltage signal of the battery unit 12 to the microcontroller 21.

The voltage regulator circuit 25 includes a voltage booster circuit 251 and a voltage bleeder circuit 252. The voltage booster circuit 251 and voltage bleeder circuit 252 each are electrically connected to the microcontroller 21 and each are directly controlled by the microcontroller 21. The voltage booster circuit 251 has an electrical contact D6, and the voltage bleeder circuit 252 has an electrical contact D7. The voltage booster circuit 251 and the voltage bleeder circuit 252 are electrically connected to the probes 11 via the electrical contacts D6 and D7, respectively and each are configured to boost and bleed the input voltage from the probes 11 based on the control of the microcontroller 21.

The voltage regulator circuit 25 is electrically connected to the positive of the battery unit 12 via two resistors R7 and R8, and is configured to charge the battery unit 12. The microcontroller 21 determines to activate the voltage booster circuit 251 or the voltage bleeder circuit 252 based on the voltage samples from the external input voltage sampling circuit 23 and the battery voltage sampling circuit 24.

The charging current monitoring circuit 26 includes a first operational amplifier circuit 261, a second operational amplifier circuit 262 and a third operational amplifier circuit 263. The first operational amplifier circuit 261 is coupled to the voltage regulator circuit 25 and the resistor R7 via an electrical contact D8 arranged at the forward input end of the first operational amplifier circuit 261, and is configured to sample the current output from the voltage regulator circuit 25. The second operational amplifier circuit 262 is coupled to the resistor R8 and the battery unit 12 via an electrical contact D9, and is configured to sample the current input to the battery unit 12. An output end of the first operational amplifier circuit 261 is electrically connected to the inverse input end of the third operational amplifier circuit 263 via a resistor R9, and an output end of second operational electrical contact 262 is electrically connected to forward input end of the third operational amplifier circuit 263 via a resistor R10. A variable resistor R11 used as a potentiometer is arranged between an inverse input end of the first operational amplifier circuit 261 and an inverse input end of the second operational amplifier circuit 262. The third operational amplifier circuit 263 is electrically connected to the microcontroller 21 via an electrical contact D10 arranged at the output end of the third operational amplifier circuit 263. The third operational amplifier circuit 263 is configured to collect the current samples from the first and second operational amplifier circuits 261 and 262, and send out the current samples to the microcontroller 21, then the microcontroller 21 obtains the magnitude of the charging current through an analog-to-digital conversion.

The solid state relay driving circuit 27 includes electrical contacts D11 and D12. The electrical contact D11 is arranged between and coupled to the resistors R7 and R8, and the electrical contact D12 is arranged between and coupled to the resistor R8 and the battery unit 12. The microcontroller 21 activates or closes the charging function of the multimeter 100 through the solid state relay driving circuit 27.

In application, user first selects one of the keys K1 and K2 based on the type of the battery unit 12 to be charged, to switch on the corresponding one of the switches SW1 and SW2, then external electrical energy can go into the charging system 20 through the probes 11. The external input voltage sampling circuit 23 first samples the input voltage, then sends out the sample signal to the microcontroller 21, at the same time the battery voltage sampling circuit 24 samples the voltage of the battery unit 12 and sends out the sample signal to the microcontroller 21. Then the microcontroller 21 activates the voltage regulator circuit 25 to regulate the input voltage from the probes 11 to be applicable for the charging mode, based on the sample signals from the external input voltage sampling circuit 23 and the battery voltage sampling circuit 24.

When the input voltage is greater than the voltage of the battery unit 12, the microcontroller 21 controls the voltage bleeder circuit 252 to bleed the input voltage, such that the input voltage is lowered to be applicable to the battery unit 12. When the input voltage is lower than the voltage of the battery unit 12, the microcontroller 21 controls the voltage booster circuit 251 to booster the input voltage, such that the input voltage is boosted to be applicable to the battery unit 12.

During the charging of the battery unit 12, the charging current monitoring circuit 26 samples and amplifies the output current from the voltage regulator circuit 25, then sends out the sample signal to the microcontroller 21. The microcontroller 21 then obtains the magnitude of the charging current through an analog-to-digital conversion, and sends out a control signal to the solid state relay driving circuit 27 based on the magnitude of the charging current. In particular, when the charging current is too high to be applicable for the battery, the microcontroller 21 sends out a stop signal to the solid state relay driving circuit 27 to temporarily stop the charging. When a next period is found that the charging current is applicable to the battery, then the microcontroller 21 sends out an activate signal to the solid state relay driving circuit 27 to activate the charging.

It is understood that once the input voltage and the resistor of the charging system are applicable to the battery unit 12, the charging current monitoring circuit 26 and the solid state relay driving circuit 27 can be omitted.

The multimeter 100 may include other powering circuits, for example, powering circuits for powering the microcontroller 21.

The multimeter 100 of the present disclosure has a charging system that charges the battery of the multimeter 100 using the external electrical energy. That is, when the multimeter 100 is in use, the battery unit 12 is being charged.

It is understood that the above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. A multimeter, comprising:
a main body;
two probes extending from the main body;
a battery unit arranged in the main body; and
a charging system arranged in the main body and configured for charging the battery unit, the charging system comprising:
a microcontroller;
an external input voltage sampling circuit electrically connected to the microcontroller, and configured for sampling an external input voltage from the probes;
a battery voltage sampling circuit electrically connected to the microcontroller, and configured for sampling a voltage of the battery unit; and
a voltage regulator circuit electrically connected the microcontroller, wherein the microcontroller compares the sampled external input voltage and the sampled voltage of the battery unit, and controls the voltage regulator circuit to regulate the external input voltage to be applicable to the battery unit based on the comparison.

2. The multimeter of claim 1, wherein the voltage regulator circuit comprises a voltage booster circuit and a voltage bleeder circuit in parallel connection to the microcontroller, the voltage booster circuit configured for boosting the external input voltage when the external input voltage is too low to be applicable to the battery unit, and the voltage bleeder circuit configured for bleeding the external input voltage when the external input voltage is too high to be applicable to the battery unit.

3. The multimeter of claim 1, wherein the charging system further comprises a charging current monitoring circuit electrically connected to the microcontroller and electrically coupled to the voltage regulator circuit and the battery unit, and configured for monitoring magnitude of the charging current and sending out a monitoring signal to the microcontroller to adjust the charging current.

4. The multimeter of claim 3, wherein the charging system further comprises a solid state relay driving circuit electrically connected to the microcontroller and electrically coupled to the voltage regulator circuit and the battery unit, the microcontroller controls the solid state relay driving circuit to activate or stop the charging process.

5. The multimeter of claim 1, wherein the charging system further comprises a charging mode selectable circuit comprising a first charging mode circuit and a second charging mode circuit in parallel connection to the microcontroller, the first charging mode circuit and the second charging mode circuit each configured to send out a corresponding battery type information to the microcontroller to activate the charging process.

6. The multimeter of claim 5, wherein the main body has two switchable keys separately arranged on a surface of the main body, the switchable keys corresponding to the respective first and second charging mode circuits.

7. The multimeter of claim 5, wherein the battery type includes micro pulse current rechargeable alkali batteries and continuous current rechargeable batteries.

* * * * *